United States Patent [19]
Wu

[11] Patent Number: 5,940,731
[45] Date of Patent: Aug. 17, 1999

[54] METHOD FOR FORMING TAPERED POLYSILICON PLUG AND PLUG FORMED

[75] Inventor: Kuo-Chang Wu, Taichung, Taiwan

[73] Assignee: Vanguard International Semiconductor Corp., Hsinchu, Taiwan

[21] Appl. No.: 08/733,004

[22] Filed: Oct. 16, 1996

[51] Int. Cl.[6] .......................... H01L 21/00; H01L 21/28; H01L 21/44

[52] U.S. Cl. ...................... 438/640; 438/637; 438/639; 438/672; 438/701; 438/733; 216/58; 257/756

[58] Field of Search ...................................... 257/754, 756; 438/584, 618, 622, 640, 637, 639, 647, 672, 701, 706, 733; 216/39, 58

[56] References Cited

U.S. PATENT DOCUMENTS

| | | |
|---|---|---|
| 4,698,128 | 10/1987 | Berglund et al. . |
| 4,902,377 | 2/1990 | Berglund et al. . |
| 5,294,296 | 3/1994 | Yoon et al. ............................. 156/657 |
| 5,517,710 | 5/1996 | Boyd et al. ............................. 437/31 |
| 5,567,270 | 10/1996 | Liu ........................................ 156/644.1 |
| 5,668,051 | 9/1997 | Chen .................................... 438/558 |
| 5,677,242 | 10/1997 | Aisou ................................... 437/195 |
| 5,677,557 | 10/1997 | Wuu et al. ............................ 257/382 |
| 5,719,089 | 2/1998 | Cherng et al. ....................... 438/637 |

*Primary Examiner*—Frank C. Eisenschenk
*Assistant Examiner*—Mary K Zeman
*Attorney, Agent, or Firm*—Tung & Associates

[57] ABSTRACT

The present invention provides a method of forming a tapered polysilicon contact plug having reduced dimensions beyond the normal resolution limit of a photolithographic method by utilizing at least one polysilicon sidewall spacer as a mask in an anisotropic etching process of an oxide layer such that a contact window of reduced dimensions can be formed for the subsequent deposition of a heavily-doped polysilicon for forming the contact plug.

17 Claims, 2 Drawing Sheets

METHOD FOR FORMING TAPERED POLYSILICON PLUG AND PLUG FORMED

FIELD OF THE INVENTION

The present invention generally relates to a method for forming a tapered polysilicon plug in a semiconductor device and the plug formed, and more particularly, relates to a method for forming tapered polysilicon plug by first forming polysilicon sidewall spacers in a contact window and then anisotropically etching away dielectric layers using the sidewall spacers as masks such that a contact plug of reduced dimension beyond that of a normal resolution of a lithographic process can be produced and the plug formed by such method.

BACKGROUND OF THE INVENTION

Modern semiconductor devices are built on a silicon substrate that has $P^+$ and $N^+$ type doped regions in the substrate as basic elements of the device that must be connected in a specific configuration to form a desired circuit. The circuit must then be accessible to the outside world through conducting pads for testing and through bonding into a packaged chip. To form a semiconductor circuit, at least one layer of a conducting material such as metal or heavily-doped polysilicon must be deposited and patterned to form contacts and interconnects between the different regions of the chip. For instance, in a typical semiconductor fabrication process, a wafer is first covered with an insulating layer, patterned and etched for contact windows (or openings) in the insulating layer, and then a conductive material is deposited and defined to form contact plugs and interconnecting leads.

Contacts to silicon or silicide are usually defined and etched in an insulating layer, i.e., a dielectric layer, by using lithographic and dry etching techniques. A dry etching technique works anisotropically to enable the making of contact openings that have high aspect ratio and fairly vertical sidewalls. Contact openings are usually filled with a conducting material such as a metal or a heavily-doped polysilicon to form vertical connections to a first level metal. Polysilicon, when used as contact plugs, must be doped N type when contacting N-regions and P type for contacting P-regions in order to avoid inter-diffusion and dopant compensation. A polysilicon film can be doped during deposition, i.e., in-situ doping, by adding arsine, phosphine or diborane to a gas mixture when a film is deposited at low pressure in a pyrolitic decomposition process of silane at approximately 600° C. Polysilicon film can also be doped after deposition by an ion implantation process or by a diffusion process. Most widely used applications of polysilicon is in metal-oxide-semiconductor (MOS) ICs. For instance, heavily-doped polysilicon films are frequently used as gate electrodes and interconnections in MOS circuits. The wide utility of polysilicon stems from its high compatibility with subsequent high-temperature processes, its excellent interface with thermal oxide, its high stability when compared to aluminum gate material, its high conformability over steep topography during deposition, and its ability to form silicide structures with an overlaying metal.

When polysilicon is used in contact plugs, it is usually formed in a dielectric layer which separates a multiplicity of plugs, interconnects and circuits. In order to form a contact plug, a contact window or opening must be first formed in the dielectric layer by selective etching to expose portions of the underlying circuit or a lower interconnect layer. After polysilicon is deposited into the contact window, it connects the lower interconnect layer to an upper interconnect layer that is subsequently deposited on top of the interlayer dielectric material. The contact window can be made in an etching process of either wet etch or dry etch. A wet etch process is performed by immersing the wafers in an appropriate etchant solution or by spraying the wafers with the solution. When a wet etch process is conducted, the etching action is isotropic in nature so that the material is etched in both the lateral and the vertical directions. Lateral etching in a wet etch process produces undercutting under a mask which is undesirable in most fabrication processes. On the other hand, a dry etch process etches anisotropically and creates vertical sidewalls in a contact window such that the top and the bottom of the window have almost the same dimensions. The dry etch process is preferred in modern sub-micron devices since it does not create undercutting problem and does not require or waste additional lateral area for a contact window. The dry etching technique also provides the benefits of reduced chemical hazard and waste treatment problems, and easily achievable process automation and tool clustering. Two of the most widely used dry etching techniques are the plasma etching technique and the reactive ion etching technique.

While dry etching technique provides significant improvement in dimensional control and therefore is popular in VLSI and ULSI fabrication methods, it also has some drawbacks. One of the drawbacks is that due to the anisotropic nature of the etching process, substantially vertical sidewalls are produced in a contact window when formed by a dry etching process. The vertical sidewalls in the contact window lead to a problem of filling the window in a subsequent deposition process for an upper interconnect layer. The problem becomes more severe as the device dimensions are further reduced and thus contact windows of even higher aspect ratios are required. For instance, when an interconnect layer of a conductive material is subsequently deposited by a conventional deposition method, particles of the conductive material cannot conform to the contours of the contact window especially at steps or sharp corners. As a result, a thinner then desired conductive material layer or a void can be formed in the contact plug. The thin conductive material layer or the void results in defects in the IC device fabricated.

Others have attempted to solve the contact window filling problem by various proposals. For instance, a method disclosed in U.S. Pat. No. 4,698,128 utilizes a modified dry etch process which creates a stepwise sloped sidewall of the contact window. However, the process requires a time consuming dry etch cycle and is not desirable in etching vias in thick dielectric layers. Another attempt, as illustrated in U.S. Pat. No. 4,902,377 is made in forming a via by separate wet and dry etching processes. In this method, a top portion of a via is first formed by a dry etching process which isotropically undercuts the masking film to create a sloped sidewall. A bottom portion of the via is then formed by a dry etching process including alternating steps between a number of isotropic mask erosion steps and a number of anisotropic dielectric etching steps. The process is difficult to carry out and requires numerous processing steps that are both labor intensive and time consuming.

It is therefore an object of the present invention to provide a method for forming a tapered polysilicon plug that does not have the drawbacks or shortcomings of the conventional plug forming techniques.

It is another object of the present invention to provide a method of forming a tapered polysilicon plug which only requires the use of a dry etching technique in forming a contact window.

It is a further object of the present invention to provide a method of forming a tapered polysilicon plug by first forming at least two polysilicon sidewall spacers in a contact window and anisotropically etching the dielectric layer such that a contact window having a sloped opening is formed.

It is still another object of the present invention to provide a method of forming a tapered polysilicon plug by repeatedly depositing and anisotropically etching away polysilicon layers such that polysilicon sidewall spacers are formed as part of a tapered polysilicon plug that is subsequently deposited.

It is yet another object of the present invention to provide a method of forming a tapered polysilicon plug by depositing and forming polysilicon sidewall spacers and then using the spacers as masks to etch away anisotropically a dielectric material that the plug is formed therein.

It is another further object of the present invention to provide a tapered polysilicon plug in a dielectric layer that has a main plug body and at least one polysilicon sidewall spacer surrounding the plug body at or near the upper end of the plug.

It is still another further object of the present invention to provide a tapered polysilicon plug that is formed in a dielectric layer including a plug body and at least two polysilicon sidewall spacers surrounding the plug body adjacent the upper end of the plug wherein the plug is deposited of a doped polysilicon material.

SUMMARY OF THE INVENTION

The present invention provides a method for forming a tapered contact window or a tapered contact plug by using polysilicon sidewall spacers as masks in the anisotropic etchings of a dielectric layer for forming the tapered contact window and the tapered contact plug.

In a preferred embodiment, a method for forming a tapered contact window is provided which includes the steps of providing a semi-conducting substrate that has a dielectric layer and a first polysilicon layer sequentially deposited on top, etching a contact window in the first polysilicon layer to expose the dielectric layer and to form a first polysilicon sidewall spacer, etching the exposed dielectric layer to a depth not exposing the semi-conducting substrate by using the first polysilicon sidewall spacer as a mask, depositing a second polysilicon layer in the contact window, etching the second polysilicon layer to expose the dielectric layer and to form a second polysilicon sidewall spacer, and etching the exposed dielectric layer to the semi-conducting substrate by using the second polysilicon sidewall spacer as a mask.

In an alternate embodiment, a method of forming a tapered polysilicon plug is provided which includes the steps of providing a semi-conducting substrate, forming an oxide layer on the substrate, depositing a first polysilicon layer on the oxide layer, depositing a first photoresist layer and patterning the layer, anisotropically etching a contact window in the first polysilicon layer to expose a first area of the oxide layer at the bottom of the window while leaving a first polysilicon sidewall spacer to substantially cover the sidewalls of the window, anisotropically etching the exposed first area of the oxide layer at the bottom of the window to a depth less than the total thickness of the oxide layer by using the first polysilicon sidewall spacer as a mask, depositing a second polysilicon layer in the contact window, depositing a second photoresist layer on the second polysilicon layer and then patterning the photoresist layer and anisotropically etching the second polysilicon layer to expose a second area of the oxide layer at the bottom of the contact window while leaving a second polysilicon sidewall spacer to substantially cover the sidewalls of the window, wherein the exposed second area of the oxide layer is smaller than the exposed first area of the oxide layer, anisotropically etching the exposed second area of oxide layer such that the underlying semi-conducting substrate is exposed by using the second polysilicon sidewall spacer as a mask, and depositing polysilicon into the contact window.

The present invention is further directed to a tapered polysilicon contact plug formed in a dielectric layer which includes a main plug body and at least one polysilicon sidewall spacer surrounding the plug body at or near the upper end of the body.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention provides a method for forming a tapered contact window and a tapered contact plug in a semiconductor device by utilizing polysilicon sidewall spacers as masks such that contact plugs of dimensions smaller than the resolution limit of a conventional lithographic method can be formed.

Figure 1:
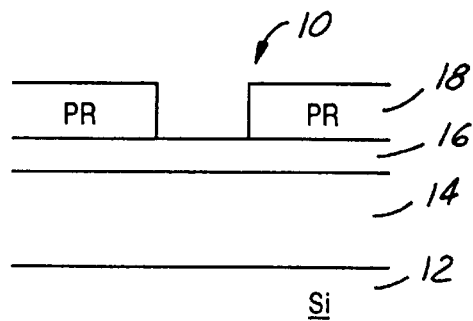
FIG. 1 is an enlarged, cross-sectional view of the present invention device having an oxide layer, a polysilicon layer and a patterned photoresist layer on top of a silicon substrate.

Referring initially to FIG. 1 where an enlarged, cross-sectional view of a semiconductor device 10 is shown. Device 10 is formed on a silicon substrate 12 and onto which a thick oxide layer 14 is formed as a dielectric layer. The oxide layer 14 can be suitably deposited of a boro-phosphor-silicate glass (BPSG) material. Any other suitable dielectric material can also be deposited. The thickness of the oxide layer 14 is in the range between about 3000 Å and about 12000 Å.

Figure 2:
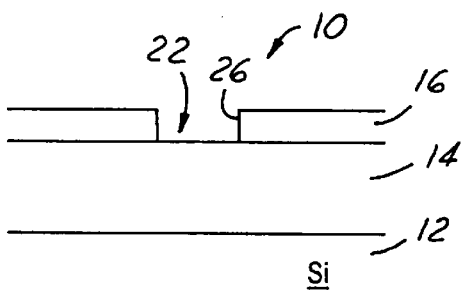
FIG. 2 is an enlarged, cross-sectional view of the present invention device having an oxide layer and a patterned polysilicon layer on top of a silicon substrate.

On top of the oxide layer 14 a first polysilicon layer 16 is deposited which is used latter as a masking layer for the etching of oxide layer 14. A suitable thickness for the polysilicon layer 16 deposited is between about 2000 Å and about 3000Å. A photoresist layer 18 is then deposited and patterned on top of the polysilicon layer 16. The polysilicon layer 16 is then etched by a dry etch technique anisotropically to open contact window 22. The anisotropic etch-back process of the polysilicon layer 16 can be carried out by using etchant gas of $Cl_2/HBr$ under an etching condition of 200~500 m Torr. This is shown in FIG. 2. The anisotropic etching process is important in the practice of the present invention for providing a substantially vertical sidewall 26 in the contact window 22. The anisotropic etch process does not produce any undercutting under the photoresist mask 18 and therefore, does not produce any lateral etching and resulting waste of chip real estate.

Figure 3:
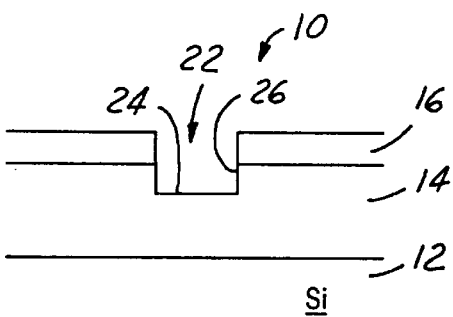
FIG. 3 is an enlarged, cross-sectional view of the present invention device having an oxide layer and a polysilicon layer on top of a silicon substrate and a contact window opened in the two layers.

In the next processing step of the present invention method, as shown in FIG. 3, polysilicon layer 16 is used as a mask for conducting an anisotropic etch process of the oxide layer 14. The oxide etch process is conducted in a time mode for a suitable length of time sufficient to etch away approximately 1500 Å thickness of the oxide layer. When the oxide etch process is conducted in a reactive ion etching apparatus, a suitable etchant gas used can be $CF_3H/CH_4$ at a temperature of 0~25° C. for a time period of approximately ½ minutes. It should be noted that the operation of the oxide etch in a time mode is important such that an exact predetermined thickness of the oxide layer can be removed. Since at least two of the anisotropic oxide etch processes will be conducted to provide a contact hole to the silicon substrate, the thickness of the oxide layer removed in each etching process must be carefully controlled.

Figure 4:
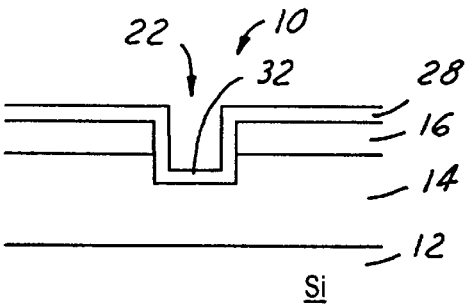
FIG. 4 is an enlarged, cross-sectional view of the present invention device of FIG. 3 having a second polysilicon layer deposited in the contact window.
Figure 5:
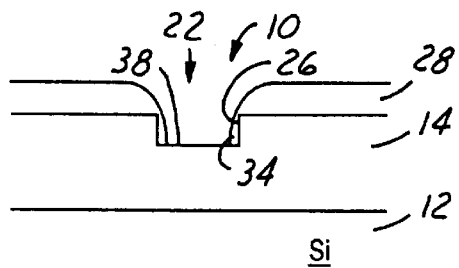
FIG. 5 is an enlarged, cross-sectional view of the present invention device of FIG. 4 the second polysilicon layer anisotropically etched to expose the oxide surface.

After the first oxide layer is removed in contact window 22, a second polysilicon layer 28 is conformably deposited onto device 10 which includes the contact window 22. Based on the high conformability over steep topography of polysilicon during deposition, a substantially uniform layer of polysilicon having a thickness between about 1000 Å and about 2500 Å can be deposited. This is shown in FIG. 4. A photomasking process (not shown) is then performed on the polysilicon layer 28 and another anisotropic etch-back process is performed during which, the bottom layer 32 is etched away while sidewall spacer 34 is left to substantially cover the oxide sidewall 26. It should be noted, as shown in FIG. 5, that newly deposited second polysilicon layer 28 and the first polysilicon layer 16 are now shown as a single polysilicon layer 28. A first oxide area 38 at the bottom of the contact window 22 is exposed after the anisotropic etch-back process for the polysilicon layer 28 is conducted.

Figure 6:
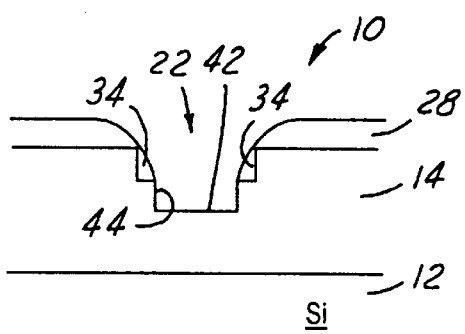
FIG. 6 is an enlarged, cross-sectional view of the present invention device of FIG. 5 having the oxide layer anisotropically etched.

In the next processing step, as shown in FIG. 6, another anisotropic etching process for the oxide layer 14 is conducted. In this process, the polysilicon sidewall spacers 34 are used as a mask such that a contact hole having a smaller oxide area 42 than oxide area 24 is formed. In this anisotropic etching process, a reactive ion etching technique similar to that used in etching the first oxide layer (shown in FIG. 3) is used. The process is carried out in a time mode such that only a predetermined thickness of the oxide layer, i.e., indicated in FIG. 6 by 44, is etched away. The time required for this etching process is approximately ½ minutes and a layer of oxide having a thickness of approximately 1500 Å is generally removed.

Figure 7:
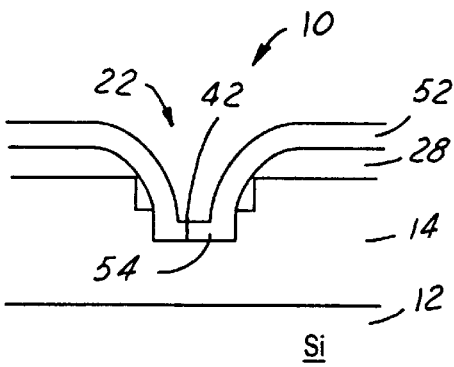
FIG. 7 is an enlarged, cross-sectional view of the present invention device of FIG. 6 having a third polysilicon layer deposited in the contact window.
Figure 8:
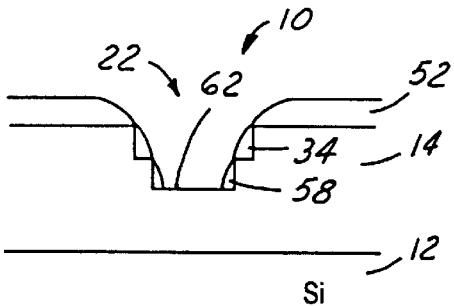
FIG. 8 is an enlarged, cross-sectional view of the present invention device of FIG. 7 having the third polysilicon layer anisotropically etched forming a second polysilicon sidewall spacer.

A third polysilicon layer 52 is then deposited on top of device 10 filling the contact window 22 and covering the exposed oxide surface 42. This is shown in FIG. 7. The deposition process used for the third polysilicon layer 52 is similar to that used in the deposition of the second polysilicon layer 28, as shown in FIG. 4. The thickness of the polysilicon layer 52 is between about 1000 Å and about 2500 Å. A photoresist layer is then deposited and patterned (not shown) and an anisotropic etch-back process is subsequently conducted to etch away the bottom layer 54 of the polysilicon layer 52. As shown in FIG. 8, a second polysilicon sidewall spacer 58 is formed in the contact window 22. A newly exposed oxide area 62 is formed after the anisotropic etch-back of the polysilicon layer 52. It should again be noted that the polysilicon layer 52 and 28 shown in FIG. 7 is now combined into a single polysilicon layer 52 shown in FIG. 8. The newly exposed oxide surface area 62 is smaller than the previously exposed oxide areas 42 and 24. This allows a gradually smaller contact hole being formed in the oxide layer 14.

Figure 9:
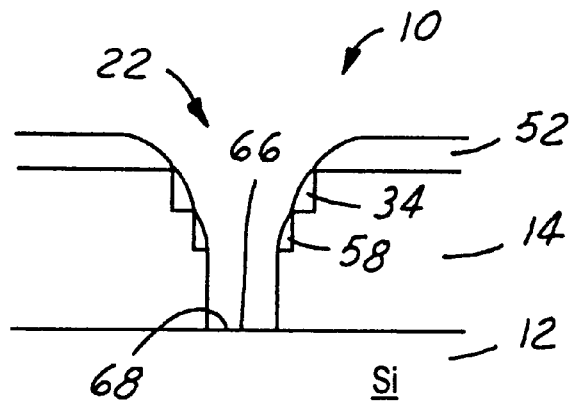
FIG. 9 is an enlarged, cross-sectional view of the present invention device of FIG. 8 having the oxide layer anisotropically etched to expose the silicon substrate.

Referring now to FIG. 9 where a new anisotropic etching process in the oxide layer 14 is conducted by using the second polysilicon sidewall spacer 58 as a mask. A new contact window area 66 is formed which has the same cross-sectional area of 62 shown in FIG. 8. The new contact hole 66 is formed by etching all the way to the silicon substrate and exposing a substrate area 68 while completing the formation of contact window 22. The present invention novel method of forming a contact window having reduced dimensions is therefore demonstrated by the preceding descriptions and FIGS. 1~9.

The present invention novel method of forming a contact window allows a smaller window to be formed that is beyond the resolution limit of a conventional lithographic method. The method is made possible by the formation of a series of polysilicon sidewall spacers 34 and 58. It should be noted that while in the preferred embodiment only two sidewall spacers are formed, any reasonable number of polysilicon sidewall spacers can be formed if a contact window of even smaller dimensions is desired. For instance, it is quite possible to use a third and a fourth polysilicon sidewall spacers prior to the etching of the oxide layer to the silicon substrate. The only process modification required is that a smaller thickness of the oxide layer should be removed after the formation of each polysilicon sidewall spacer.

Figure 10:
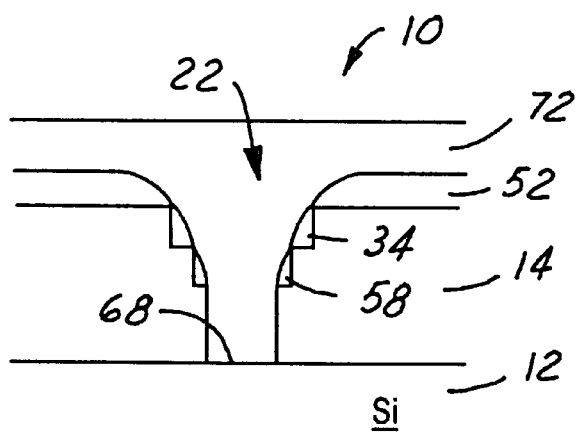
FIG. 10 is an enlarged, cross-sectional view of the present invention device of FIG. 9 having polysilicon deposited in the contact window.
Figure 11:
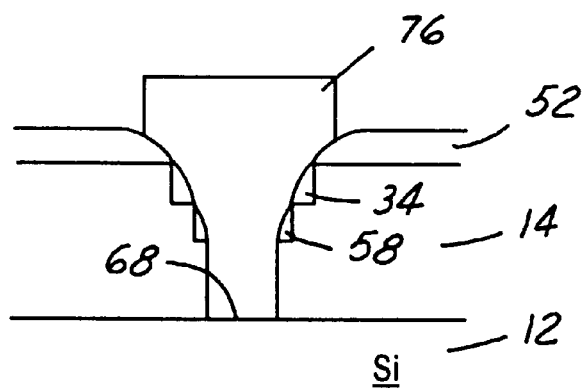
FIG. 11 is an enlarged, cross-sectional view of the present invention device of FIG. 10 having a polysilicon plug formed in the contact window.

An alternate embodiment of the present invention illustrates the formation of a contact plug in the contact window 22 formed is shown in FIGS. 10 and 11. In FIG. 10, a conformal layer of polysilicon 72 is deposited on top of device 10. In order to improve the electrical conductivity of the polysilicon, it is normally doped with a heavy dosage of arsenic or phosphorous ions. The doping of the polysilicon layer can be conducted either in-situ during the deposition process or subsequently after the formation of the layer by ion implantation. The polysilicon layer 72 is then photomasked and patterned (not shown) resulting in the formation of contact plug 76. This is shown in FIG. 11.

While the present invention has been described in an illustrative manner, it should be understood that the terminology used is intended to be in a nature of words of description rather than of limitation.

Furthermore, while the present invention has been described in terms of a preferred and an alternate embodiments, it is to be appreciated that those skilled in the art will readily apply these teachings to other possible variations of the inventions.

The embodiment of the invention in which an exclusive property or privilege is claimed are defined as follows:

1. A method for forming a tapered contact window comprising the steps of:

providing a semi-conducting substrate having a dielectric layer and a first polysilicon layer sequentially deposited on top, etching a contact window in said first polysilicon layer exposing said dielectric layer and forming a first polysilicon sidewall spacer, anisotropically etching said exposed dielectric layer to a first area an da to a depth not exposing said semi-conducting substrate by using said first polysilicon sidewall spacer as a mask, depositing a second polysilicon layer in sad contact window, etching said second polysilicon layer exposing said dielectric layer and forming a second polysilicon sidewall spacer, depositing and etching a third polysilicon layer for forming a third polysilicon sidewall spacer and etching said exposed dielectric layer to expose said semi-conducting substrate to a second area smaller than said first area by using said second polysilicon sidewall spacer as a mask.

2. A method according to claim 1, wherein said etching process for said first, said second, said third polysilicon layer and said dielectric layer is conducted by an anisotropic etching technique.

3. A method according to claim 1 further comprising the steps of depositing and etching a fourth polysilicon layer and forming a fourth polysilicon sidewall spacer prior to said etching step for exposing said semi-conducting substrate.

4. A method according to claim 1, wherein said semi-conducting substrate is a silicon substrate.

5. A method according to claim 1, wherein said dielectric layer is an oxide layer.

6. A method according to claim 1 further comprising the steps of depositing and patterning a photoresist layer prior to etching said first and said second polysilicon layers.

7. A method according to claim 1, wherein said first and said second polysilicon sidewall spacers substantially cover the dielectric material in the sidewalls of said contact window.

8. A method according to claim 1 further comprising a final step of depositing polysilicon into said contact window.

9. A method of forming a tapered polysilicon contact plug comprising the steps of:

providing a semi-conducting substrate, forming an oxide layer on said substrate, depositing a first polysilicon layer on aid oxide layer, depositing a first photoresist layer on said first polysilicon layer and patterning said first photoresist layer, anisotropically etching a contact window in said first polysilicon layer exposing a first area of said oxide layer at the bottom of said window leaving a first polysilicon sidewall spacer substantially covering the sidewalls of said window, anisotropically etching said exposed first area of oxide layer at the bottom of said window to a depth less than the total thickness of said oxide layer by using, said first polysilicon sidewall spacer as a mask, depositing a second polysilicon layer in said contact window, depositing a second photoresist layer on said second polysilicon layer and patterning said second photoresist layer, anisotropically etching said second polysilicon layer exposing a second area of said oxide layer at the bottom of said contact window leaving a second polysilicon sidewall spacer substantially covering the sidewalls of said window, said exposed second area of said oxide layer being smaller than said exposed first area of said oxide layer, depositing and etching a third polysilicon layer and forming a third polysilicon sidewall spacer anisotropically etching said exposed second area of oxide layer to expose said underlying semi-conducting substrate by using said second polysilicon sidewall spacer as a mask, and depositing polysilicon into said contact window.

10. A method according to claim 9, wherein said semi-conducting substrate is a silicon substrate.

11. A method according to claim 9, wherein said polysilicon deposited into said contact window is a doped polysilicon.

12. A method according to claim 9 further comprising the steps of depositing and etching a fourth polysilicon layer and forming a fourth polysilicon sidewall spacer, prior to said etching step for exposing said semi-conducting substrate.

13. A method according to claim 9 further comprising the steps of stripping said first photoresist layer prior to depositing said second polysilicon layer, and stripping said second photoresist layer prior to depositing said polysilicon into said contact window.

14. A tapered polysilicon contact plug formed in a dielectric layer comprising a main plug body and at least two polysilicon sidewall spacers surrounding said main plug body adjacent the upper end of said body.

15. A tapered polysilicon plug according to claim 14, wherein said main plug body is formed of doped polysilicon.

16. A tapered polysilicon plug according to claim 14, wherein said dielectric layer is an oxide layer deposited on a semi-conducting substrate.

17. A tapered polysilicon plug according to claim 14, wherein said dielectric layer is an oxide layer deposited on a silicon substrate.

* * * * *